US011296689B2

(12) United States Patent
Tsaur et al.

(10) Patent No.: US 11,296,689 B2
(45) Date of Patent: Apr. 5, 2022

(54) OUTPUT CIRCUIT HAVING VOLTAGE-WITHSTANDING MECHANISM

(71) Applicant: REALTEK SEMICONDUCTOR CORPORATION, Hsinchu (TW)

(72) Inventors: Tay-Her Tsaur, Tai-Nan (TW); Tsung-Yen Tsai, Hsinchu County (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 17/029,094

(22) Filed: Sep. 23, 2020

(65) Prior Publication Data

US 2021/0099168 A1 Apr. 1, 2021

(30) Foreign Application Priority Data

Sep. 30, 2019 (TW) ................................ 10813537.4

(51) Int. Cl.
*H03K 17/081* (2006.01)
(52) U.S. Cl.
CPC ............................ *H03K 17/08104* (2013.01)
(58) Field of Classification Search
CPC ....... H03K 17/08104; H03K 17/08142; H03K 17/08
(Continued)

(56) References Cited

U.S. PATENT DOCUMENTS 4,481,432 A * 11/1984 Davies, Jr. ............. H03K 5/023
257/E27.11
8,797,009 B2 8/2014 Oddoart
(Continued)

FOREIGN PATENT DOCUMENTS

TW 201909554 A 3/2019

OTHER PUBLICATIONS

OA letter of the counterpart TW application (appl. No. 108135374) mailed on Jun. 11, 2020. Summary of the OA letter: 1 .The paragraph showing the list of the symbols in the diagram and the paragraphs [0035] of the specification have editorial problems 2.Claim 2 has an editorial problem 3.Claim 1 is rejected as being unpatentable over the disclosure of the cited reference 1 (TW 201909554A, also published as US2020145599A1). 4. Claims 3~10 are allowed.
(Continued)

*Primary Examiner* — Thienvu V Tran
*Assistant Examiner* — Bart Iliya
(74) *Attorney, Agent, or Firm* — WPAT, PC

(57) ABSTRACT

The present disclosure discloses an output circuit having a voltage-withstanding mechanism that includes a PMOS, a NMOS, a voltage-withstanding auxiliary NMOS and a voltage-withstanding auxiliary circuit. The PMOS includes a first source terminal and a first drain terminal coupled to a voltage source and an output terminal and a first gate receiving a first input signal. The NMOS includes a second source terminal and a second drain terminal coupled to a ground terminal and a connection terminal and a second gate receiving a second input signal. The auxiliary NMOS includes a third drain terminal and a third source terminal coupled to the output terminal and the connection terminal. The auxiliary circuit is coupled to the voltage source and a third gate of the auxiliary NMOS and provides a current conducting mechanism and a resistive mechanism respectively when the output terminal is operated at a logic high level and a logic low level.

10 Claims, 2 Drawing Sheets

(58) Field of Classification Search
USPC .......................................................... 361/91.5
See application file for complete search history.

(56) References Cited

U.S. PATENT DOCUMENTS

| | | | |
|---|---|---|---|
| 2003/0169075 A1* | 9/2003 | Fan ................... | H03K 19/00315 |
| | | | 326/86 |
| 2009/0201000 A1* | 8/2009 | Kojima ............... | H02M 3/1588 |
| | | | 323/282 |
| 2012/0229102 A1 | 9/2012 | Burns et al. | |
| 2016/0285454 A1 | 9/2016 | Gupta et al. | |
| 2020/0145599 A1 | 5/2020 | Matsuzaki et al. | |
| 2020/0333817 A1* | 10/2020 | Wu ......................... | G05F 1/613 |

OTHER PUBLICATIONS

Tsung-Yen Tsai, "Stacked NMOS DC-To-DC Power Conversion(US 2012/0229102 A1)", PMU_tiger_team_20190423.

* cited by examiner

400
OUTPUT CIRCUIT HAVING VOLTAGE-WITHSTANDING MECHANISM

BACKGROUND OF THE INVENTION

1. Field of the Invention

The present disclosure relates to an output circuit having a voltage-withstanding mechanism.

2. Description of Related Art

In integrated circuit (IC) design, an output circuit is usually disposed as the last stage circuit of a circuit module such that a signal processed by the circuit module can be outputted to an external circuit module. Based on an amount of a voltage of a voltage source that the output circuit operates accordingly, components in the output circuit, e.g. PMOS transistors or NMOS transistors, need to have a reliable voltage-withstanding ability to withstand the voltage of the voltage source such that the components are able to operate in a reasonable range without being damaged.

However, in some operation environments, the voltage source may operate under an unstable condition such that the voltage thereof is too high. Under such a situation, if an auxiliary circuit design that helps the components of the output circuit increase the voltage-withstanding ability does not exist, the components are easily damaged and therefore are not able to operate.

SUMMARY OF THE INVENTION

In consideration of the problem of the prior art, an object of the present disclosure is to provide an output circuit having a voltage-withstanding mechanism.

The present disclosure discloses an output circuit having a voltage-withstanding mechanism that includes a PMOS transistor, a NMOS transistor, a voltage-withstanding auxiliary NMOS transistor and a voltage-withstanding auxiliary circuit. The PMOS transistor includes a first source terminal and a first drain terminal electrically coupled to a voltage source and an output terminal respectively and a first gate configured to receive a first input signal. The NMOS transistor includes a second source terminal and a second drain terminal electrically coupled to a ground terminal and a connection terminal respectively and a second gate configured to receive a second input signal. The voltage-withstanding auxiliary NMOS transistor includes a third drain terminal and a third source terminal electrically coupled to the output terminal and the connection terminal respectively. The voltage-withstanding auxiliary circuit is electrically coupled between the voltage source and a third gate of the voltage-withstanding auxiliary NMOS such that the voltage-withstanding auxiliary NMOS is electrically coupled to the voltage source through the voltage-withstanding auxiliary circuit to keep conducting. The voltage-withstanding auxiliary circuit is configured to provide a current conducting mechanism when the output terminal is operated at a logic high level such that the third gate outputs a current to the voltage source and provide a resistive mechanism when the output terminal is operated at a logic low level such that the third gate has a voltage drop along with the output terminal.

These and other objectives of the present disclosure will no doubt become obvious to those of ordinary skill in the art after reading the following detailed description of the preferred embodiments that are illustrated in the various figures and drawings.

DETAILED DESCRIPTION OF THE PREFERRED EMBODIMENTS

An aspect of the present invention is to provide an output circuit having a voltage-withstanding mechanism to increase the voltage-withstanding ability of the output circuit to further increase the reliability of the output circuit.

Figure 1:
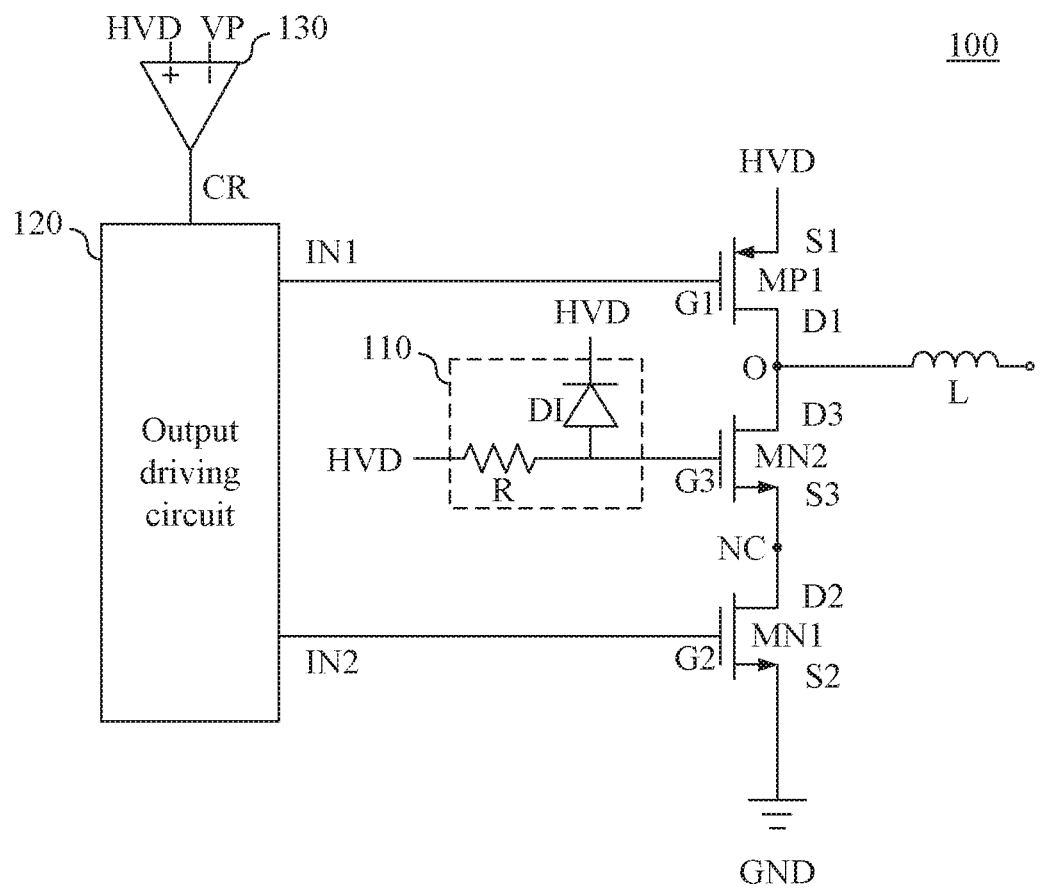
FIG. 1 illustrates a circuit diagram of an output circuit having a voltage-withstanding mechanism according to an embodiment of the present invention.

Reference is now made to FIG. 1. FIG. 1 illustrates a circuit diagram of an output circuit 100 having a voltage-withstanding mechanism according to an embodiment of the present invention. The output circuit 100 includes a PMOS transistor MP1, a NMOS transistor MN1, a voltage-withstanding auxiliary NMOS transistor MN2 and a voltage-withstanding auxiliary circuit 110.

The PMOS transistor MP1 includes a first source terminal 51 and a first drain terminal D1 electrically coupled to a voltage source HVD and an output terminal O respectively, and a first gate G1 configured to receive a first input signal IN1. The NMOS transistor MN1 includes a second source terminal S2 and a second drain terminal D2 electrically coupled to a ground terminal GND and a connection terminal NC respectively, and a second gate G2 configured to receive a second input signal IN2.

The voltage-withstanding auxiliary NMOS transistor MN2 is configured to provide a resistive effect to further provide the NMOS transistor MN1 a voltage-withstanding mechanism to avoid the damage of the NMOS transistor MN1 during operation due to a voltage variation. More specifically, the voltage-withstanding auxiliary NMOS transistor MN2 includes a third drain D3 terminal and a third source terminal S3 electrically coupled to the output terminal O and the connection terminal NC respectively. In an embodiment, the third gate G3 of the voltage-withstanding auxiliary NMOS transistor MN2 is electrically coupled to the voltage source HVD through the voltage-withstanding auxiliary circuit 110 to keep receiving the voltage of the voltage source HVD through the voltage-withstanding auxiliary circuit 110 and keep conducting.

The voltage-withstanding auxiliary circuit 110 provides the voltage-withstanding auxiliary NMOS transistor MN2 a voltage-withstanding mechanism to avoid the damage of the voltage-withstanding auxiliary NMOS transistor MN2 during operation due to a voltage variation. In an embodiment, as illustrated in FIG. 1, the voltage-withstanding auxiliary circuit 110 includes a diode DI and a resistor R. The diode DI includes a cathode electrically coupled to the voltage source HVD and an anode electrically coupled to the third gate G3 of the voltage-withstanding auxiliary NMOS transistor MN2. The resistor R is electrically coupled between the voltage source HVD and the third gate G3 of the voltage-withstanding auxiliary NMOS transistor MN2.

The operation and the voltage-withstanding mechanism of the output circuit 100 are described in the following paragraphs.

Based on the configuration described above, the output circuit 100 can be separated by the output terminal O as an upper half bridge that includes the PMOS transistor MP1 and a lower half bridge that includes the NMOS transistor MN1 and the voltage-withstanding auxiliary NMOS transistor MN2. Further, the output terminal O can be electrically coupled to an external circuit (not illustrated) through such as, but not limited to an inductor L further included in the output circuit, to output the voltage thereof.

In an embodiment, the output circuit 100 further includes an output driving circuit 120 electrically coupled to the first gate G1 of the PMOS transistor MP1 and the second gate G2 of the NMOS transistor MN1 and is configured to generate the first input signal IN1 and the second input signal IN2 to the first gate G1 and the second gate G2 respectively.

Under a first operation status, the output driving circuit 120 generates the first input signal IN1 and the second input signal IN2 that are at the logic low level respectively. As a result, the PMOS transistor MP1 is conducted due to the control performed on the first gate G1 by the first input signal IN1 having the logic low level to inject a current to the output terminal O according to the voltage source HVD. On the other hand, the NMOS transistor MN1 is unconducted due to the control performed on the second gate G2 by the second input signal IN2 having the logic low level.

As a result, under the first operation status, the voltage of the output terminal O increases to the logic high level due to the turn-off of the lower half bridge and the turn-on of the upper half bridge.

Under a second operation status, the output driving circuit 120 generates the first input signal IN1 and the second input signal IN2 that are at the logic high level respectively. As a result, the PMOS transistor MP1 is unconducted due to the control performed on the first gate G1 by the first input signal IN1 having the logic high level. On the other hand, the NMOS transistor MN1 is conducted due to the control performed on the second gate G2 by the second input signal IN2 having the logic high level to drain a current from the output terminal O according to the ground terminal GND.

As a result, under the second operation status, the voltage of the output terminal O decreases to the logic low level due to the turn-on of the lower half bridge and the turn-off of the upper half bridge.

In some approaches, the output circuit 100 does not include the voltage-withstanding auxiliary NMOS transistor MN2 such that the second drain terminal D2 and the second source terminal S2 of the NMOS transistor MN1 are directly electrically coupled to the output terminal O and the ground terminal GND respectively. Under such a condition, since a coupling effect of a parasitic capacitor is presented between the second drain D2 and the second gate G2 of the NMOS transistor MN1, the output terminal O forces the voltage of the second gate G2 to become higher when the output terminal O operates at the logic high level to further decrease the break down voltage of the NMOS transistor MN1.

When the operation environment of the output circuit 100 is not ideal such that the voltage of the voltage source HVD is higher than a rated operation voltage, the voltage of the logic high level of the output terminal O becomes higher. The voltage of the second gate G2 of the NMOS transistor MN1 thus becomes even higher to further decrease the break down voltage so that the NMOS transistor MN1 is damaged accordingly.

By disposing the voltage-withstanding auxiliary NMOS transistor MN2, a resistive effect is provided such that the second drain D2 of the NMOS transistor MN1 actually receives the voltage of the voltage source HVD through a voltage drop generated due to the resistive effect. As a result, the NMOS transistor MN1 does not receive a voltage that is too high due to the presence of the voltage-withstanding auxiliary NMOS transistor MN2. The possibility of the occurrence of the damage of the NMOS transistor MN1 can be lowered.

However, for the voltage-withstanding auxiliary NMOS transistor MN2, the same voltage-withstanding issue also exists. Since a coupling effect of a parasitic capacitor is presented between the third drain D3 and the third gate G3 of the voltage-withstanding auxiliary NMOS transistor MN2, the output terminal O forces the voltage of the third gate G3 to be higher when the output terminal O operates at the logic high level to further decrease the break down voltage of the voltage-withstanding auxiliary NMOS transistor MN2.

When the operation environment of the output circuit 100 is not ideal such that the voltage of the voltage source HVD is higher than a rated operation voltage, the voltage of the logic high level of the output terminal O becomes higher. The voltage of the third gate G3 of the voltage-withstanding auxiliary NMOS transistor MN2 thus becomes even higher to further decrease the break down voltage so that the voltage-withstanding auxiliary NMOS transistor MN2 is damaged accordingly.

Though the resistor R of the voltage-withstanding auxiliary circuit 110 is able to force the current to be outputted from the third gate G3 of the voltage-withstanding auxiliary NMOS transistor MN2 to the voltage source HVD under the condition that the output terminal operates at the logic high level, the rate of the current flow is slow. As a result, the diode DI of the voltage-withstanding auxiliary circuit 110 provides a quick current conducting mechanism under the condition that the output terminal operates at the logic high level. When the operation environment of the output circuit 100 is not ideal such that the voltage of the logic high level of the output terminal O becomes higher to increase the voltage of the third gate G3, a current quickly flows from the third gate G3 of the voltage-withstanding auxiliary NMOS transistor MN2 to the voltage source HVD through the diode DI.

On the other hand, in an embodiment, a third operation status can exist between the first operation status and the second operation status, e.g. when the operation status switches from the first operation status to the second operation status or when the operation status switches from the second operation status to the first operation status, to avoid the occurrence of short-circuit. In the third operation status, the output driving circuit 120 generates the first input signal IN1 and the second input signal IN2 at the logic high level and the logic low level respectively. As a result, the PMOS transistor MP1 is unconducted due to the control performed on the first gate G1 by the first input signal IN1 having the logic high level. On the other hand, the NMOS transistor MN1 is unconducted due to the control performed on the second gate G2 by the second input signal IN2 having the logic low level.

Under such a condition, due to the current continuity of the inductor L, the parasitic diode of the base of the voltage-withstanding auxiliary NMOS transistor MN2 generates a current flowing from the connection terminal NC to the output terminal O and forces the output terminal O to generate a voltage lower than a normal operation voltage of the logic low level. A larger voltage difference is thus generated between the third gate G3 and the third drain D3 of the voltage-withstanding auxiliary NMOS transistor MN2.

As a result, the resistor R of the voltage-withstanding auxiliary circuit 110 provides a resistive mechanism such that the third gate G3 does not directly receive the input of the voltage source HVD. Due to the presence of the coupling effect of the parasitic capacitor between the third drain D3 and the third gate G3, the voltage of the third gate G3 can be lowered along with the decreasing of the voltage of the output terminal O. The damage caused due to the large voltage difference between the third gate G3 and the third drain D3 of the voltage-withstanding auxiliary NMOS transistor MN2 can be avoided.

In an embodiment, the output circuit 100 in FIG. 1 may selectively further include a determining circuit 130 configured to determine whether a voltage of the voltage source HVD is larger than a predetermined voltage VP to generate a determining result CR. The output driving circuit 120 is further configured to drive the first input signal IN1 to be at the logic high level and drive the second input signal IN2 to be at the logic low level when the determining result CR shows that the voltage of the voltage source HVD is larger than the predetermined voltage VP. As a result, the PMOS transistor MP1 is turned off (unconducted) due to the control performed on the first gate G1 by the first input signal IN1 having the logic high level. On the other hand, the NMOS transistor MN1 is turned off (unconducted) due to the control performed on the second gate G2 by the second input signal IN2 having the logic low level.

Therefore, by using the determining mechanism of the determining circuit 130 and the operation of the output driving circuit 120 according to the determining result CR, the output circuit 100 can stop to operate when the voltage of the voltage source HVD is too high to provide a further protection mechanism to avoid the damage of the internal components.

Figure 2:
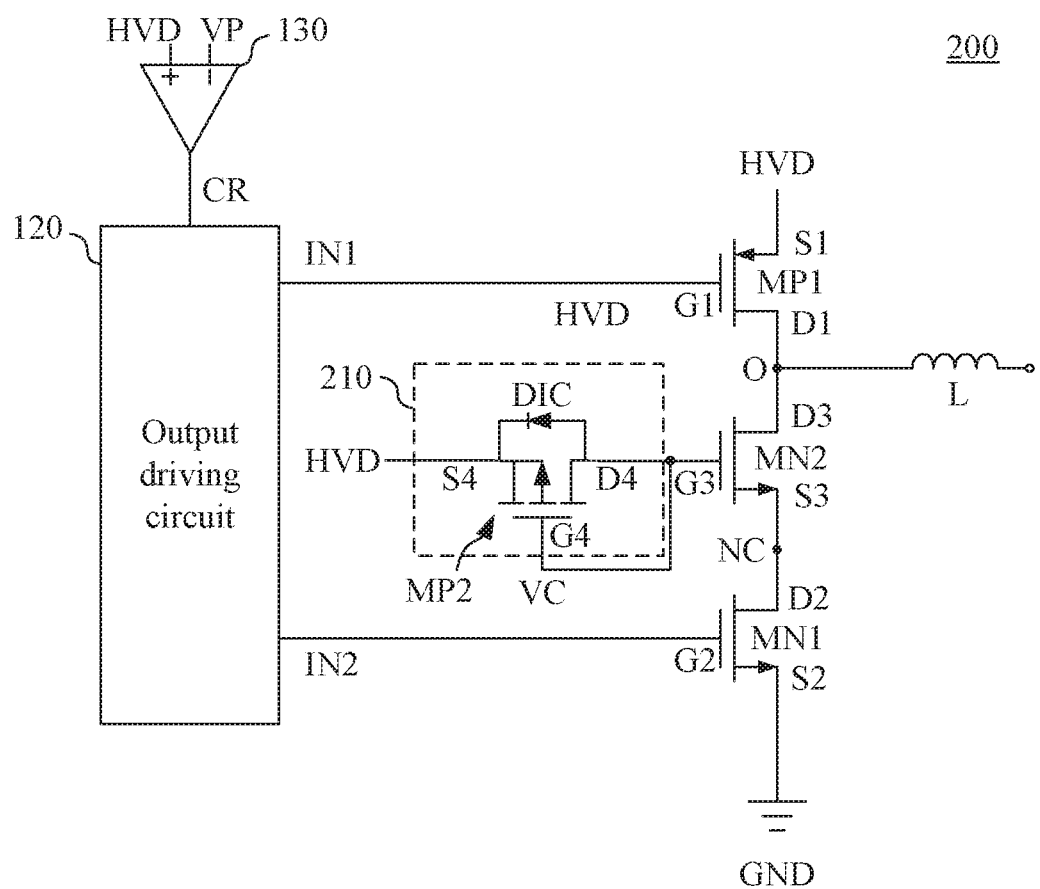
FIG. 2 illustrates a circuit diagram of an output circuit having a voltage-withstanding mechanism according to another embodiment of the present invention.

Reference is now made to FIG. 2. FIG. 2 illustrates a circuit diagram of an output circuit 200 having a voltage-withstanding mechanism according to another embodiment of the present invention.

Identical to the output circuit 100 illustrated in FIG. 1, the output circuit 200 includes the PMOS transistor MP1, the NMOS transistor MN1 and the voltage-withstanding auxiliary NMOS transistor MN2. The configuration and operation thereof are the same as those of the components illustrated in FIG. 1. The detail is not described herein.

The difference of the output circuit 200 from the output circuit 100 illustrated in FIG. 1 is that the voltage-withstanding auxiliary circuit 210 included in the output circuit 200 in the present embodiment is implemented by using a voltage-withstanding auxiliary PMOS transistor MP2.

The fourth source terminal S4 and the fourth drain terminal D4 of the voltage-withstanding auxiliary PMOS transistor MP2 are respectively electrically coupled to the voltage source HVD and the third gate G3 of the voltage-withstanding auxiliary NMOS transistor MN2. The fourth gate G4 of the voltage-withstanding auxiliary PMOS transistor MP2 is controlled to be conducted by the control voltage VC to provide the resistive mechanism described above.

Further, a parasitic diode DIC exists between the fourth source terminal S4 and the fourth drain terminal D4 of the voltage-withstanding auxiliary PMOS transistor MP2 and provides the current conducting mechanism described above.

As a result, the voltage-withstanding auxiliary circuit 210 of the present embodiment can be implemented by the voltage-withstanding auxiliary PMOS transistor MP2 to provide the voltage-withstanding auxiliary NMOS transistor MN2 a better voltage-withstanding ability.

It is appreciated that the embodiments described above are merely an example. In other embodiments, it should be appreciated that many modifications and changes may be made by those of ordinary skill in the art without departing from the spirit of the invention.

In summary, the output circuit having a voltage-withstanding mechanism can provide the NMOS transistor and the voltage-withstanding auxiliary NMOS transistor a better voltage-withstanding ability by disposing the voltage-withstanding auxiliary NMOS transistor and the voltage-withstanding auxiliary circuit and further increase the reliability of the operation of the circuit.

The aforementioned descriptions represent merely the preferred embodiments of the present disclosure, without any intention to limit the scope of the present disclosure thereto. Various equivalent changes, alterations, or modifications based on the claims of present disclosure are all consequently viewed as being embraced by the scope of the present disclosure.

What is claimed is:

1. An output circuit having a voltage-withstanding mechanism, comprising:
    a PMOS transistor comprising a first source terminal and a first drain terminal electrically coupled to a voltage source and an output terminal respectively and a first gate configured to receive a first input signal;
    a NMOS transistor comprising a second source terminal and a second drain terminal electrically coupled to a ground terminal and a connection terminal respectively and a second gate configured to receive a second input signal;
    a voltage-withstanding auxiliary NMOS transistor comprising a third drain terminal and a third source terminal electrically coupled to the output terminal and the connection terminal respectively; and
    a voltage-withstanding auxiliary circuit electrically coupled between the voltage source and a third gate of the voltage-withstanding auxiliary NMOS such that the voltage-withstanding auxiliary NMOS is electrically coupled to the voltage source through the voltage-withstanding auxiliary circuit to keep conducting, and the voltage-withstanding auxiliary circuit is configured for:
        providing a current conducting mechanism when the output terminal is operated at a logic high level such that the third gate outputs a current to the voltage source; and
        providing a resistive mechanism when the output terminal is operated at a logic low level such that the third gate has a voltage drop along with the output terminal.

2. The output circuit of claim 1, wherein the voltage-withstanding auxiliary circuit comprises:
    a resistor electrically coupled between the voltage source and the third gate; and
    a diode comprising a cathode electrically coupled to the voltage source and an anode electrically coupled to the voltage-withstanding auxiliary NMOS transistor.

3. The output circuit of claim 1, wherein the voltage-withstanding auxiliary circuit is a conducted voltage-withstanding auxiliary PMOS transistor configured to provide the resistive mechanism and a parasitic diode of the voltage-withstanding auxiliary PMOS transistor provides the current conducting mechanism.

4. The output circuit of claim 1, wherein the first input signal and the second input signal are at the logic low level respectively under a first operation status such that the output terminal is at the logic high level, and the first input signal and the second input signal are at the logic high level respectively under a second operation status such that the output terminal is at the logic low level.

5. The output circuit of claim 4, wherein the first input signal and the second input signal are at the logic high level and the logic low level respectively under a third operation status between the first operation status and the second operation status.

6. The output circuit of claim 4, wherein a voltage of the output terminal is smaller than the logic low level under the third operation status.

7. The output circuit of claim 4, further comprising an output driving circuit configured to generate the first input signal and the second input signal.

8. The output circuit of claim 7, further comprising a determining circuit configured to determine whether a voltage of the voltage source is larger than a predetermined voltage to generate a determining result;
wherein the output driving circuit is further configured to drive the first input signal to be at the logic high level and drive the second input signal to be at the logic low level when the determining result shows that the voltage of the voltage source is larger than the predetermined voltage to turn off the PMOS transistor and the NMOS transistor.

9. The output circuit of claim 1, wherein a coupling effect of a parasitic capacitor is presented between the third gate of the voltage-withstanding auxiliary NMOS transistor and the output terminal such that a voltage of the third gate changes along with the voltage of the output terminal.

10. The output circuit of claim 1, wherein the output terminal is electrically coupled to an external circuit through an inductor.

* * * * *